(12) United States Patent
Sakurayama

(10) Patent No.: US 12,052,826 B2
(45) Date of Patent: Jul. 30, 2024

(54) COMPONENT MOUNTING MACHINE AND COMPONENT MOUNTING SYSTEM

(71) Applicant: FUJI CORPORATION, Chiryu (JP)

(72) Inventor: Takeshi Sakurayama, Nisshin (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 17/904,340

(22) PCT Filed: Feb. 20, 2020

(86) PCT No.: PCT/JP2020/006872
§ 371 (c)(1),
(2) Date: Aug. 16, 2022

(87) PCT Pub. No.: WO2021/166179
PCT Pub. Date: Aug. 26, 2021

(65) Prior Publication Data
US 2023/0067782 A1 Mar. 2, 2023

(51) Int. Cl.
*H05K 13/08* (2006.01)
*H05K 13/02* (2006.01)

(52) U.S. Cl.
CPC ........ *H05K 13/0812* (2018.08); *H05K 13/021* (2013.01)

(58) Field of Classification Search
CPC ............. H05K 13/021; H05K 13/0419; H05K 13/0812; H05K 13/082
See application file for complete search history.

(56) References Cited

U.S. PATENT DOCUMENTS 5,724,722 A 3/1998 Hashimoto
7,363,702 B2 * 4/2008 Kondo ............... H05K 13/0061
29/742
(Continued)

FOREIGN PATENT DOCUMENTS

JP 8-274500 A 10/1996
JP 2937785 B2 8/1999
(Continued)

OTHER PUBLICATIONS

International Search Report Issued May 19, 2020, in PCT/JP2020/006872, filed on Feb. 20, 2020, 2 pages.

*Primary Examiner* — Paul D Kim
(74) *Attorney, Agent, or Firm* — Oblon, McClelland, Maier & Neustadt, L.L.P.

(57) ABSTRACT

A component mounting machine includes an imaging device configured to image a supply position, to which a component is supplied from a component supply device, from above, a component detecting sensor configured to detect the component. A control device acquires component information related to the component supplied by the component supply device when a predetermined determination condition is established. Then the control device selects from multiple processing including first determination processing for determining presence or absence of a component shortage of the component supply device by determining presence or absence of the component at the supply position based on a captured image, and second determination processing for determining presence or absence of a component shortage of the component supply device by detecting the presence or absence of the component at the supply position by the component detecting sensor.

6 Claims, 10 Drawing Sheets

(56) References Cited

U.S. PATENT DOCUMENTS

| | | | |
|---|---|---|---|
| 10,960,999 B2 * | 3/2021 | Eguchi | ............... B65H 19/1852 |
| 2013/0110464 A1 | 5/2013 | Ishida | |
| 2016/0198598 A1 | 7/2016 | Matsumori et al. | |
| 2021/0007255 A1 * | 1/2021 | Hayakawa | ......... H05K 13/0812 |

FOREIGN PATENT DOCUMENTS

| | | | |
|---|---|---|---|
| JP | 6043994 B2 | 12/2016 | |
| JP | 6103800 B2 | 3/2017 | |
| JP | JPWO2019/058530 A1 | 3/2019 | |
| WO | WO-2019142299 A1 * | 7/2019 | |

* cited by examiner

COMPONENT MOUNTING MACHINE AND COMPONENT MOUNTING SYSTEM

TECHNICAL FIELD

The present specification discloses a component mounting machine and a component mounting system.

BACKGROUND ART

Conventionally, in a component mounting machine for mounting a component, which is held in a cavity section of a carrier tape fed from a feeder device, on a board by taking out the component by a mounting head, it is proposed to determine whether the remaining number of components, being held by the carrier tape, has become zero (for example, refer to Patent Literature 1). The component mounting machine includes a camera device provided in the mounting head. Then, the component mounting machine images a terminal side cavity section formed on a terminal side of the carrier tape by the camera device, and determines whether there is a component in the terminal side cavity section based on the obtained captured image.

In addition, there has been proposed a system including multiple component mounting machines and a replacement robot for replacing a feeder to be mounted on each component mounting machine (for example, refer to Patent Literature 2). In a case where a component shortage occurs in the feeder mounted on the component mounting machine, the replacement robot collects the feeder of the component shortage and replenishes the next feeder.

PATENT LITERATURE

Patent Literature 1: WO 2017/022098
Patent Literature 2: JP-A-2017-11316

BRIEF SUMMARY

Technical Problem

However, in the component mounting machine described in Patent Literature 1 described above, it may be difficult to determine the presence or absence of the component based on the captured image by the camera, depending on a type of the component. In this case, the component mounting machine cannot appropriately determine the presence or absence of the component shortage.

A main object of the present disclosure is to more accurately perform a determination of a component shortage of a component supply device.

Solution to Problem

The present disclosure adopts the following means to achieve the main object described above.

A component mounting machine of the present disclosure is a component mounting machine that mounts a component, which is supplied from a component supply device to a supply position, on a target object by taking out the component by a mounting head, the component mounting machine including: an imaging device configured to image the supply position from above; a component detecting sensor configured to detect the component; and a control device configured to acquire component information related to the component supplied by the component supply device when a predetermined determination condition is established and to select and execute, based on the component information, any one of multiple processing including first determination processing for determining presence or absence of a component shortage of the component supply device by determining presence or absence of the component at the supply position based on a captured image that is obtained by imaging the supply position by the imaging device, and second determination processing for determining presence or absence of the component shortage of the component supply device by detecting the presence or absence of the component at the supply position by the component detecting sensor.

According to the component mounting machine of the present disclosure, it is possible to more accurately determine the component shortage of the component supply device.

DESCRIPTION OF EMBODIMENTS

Figure 1:
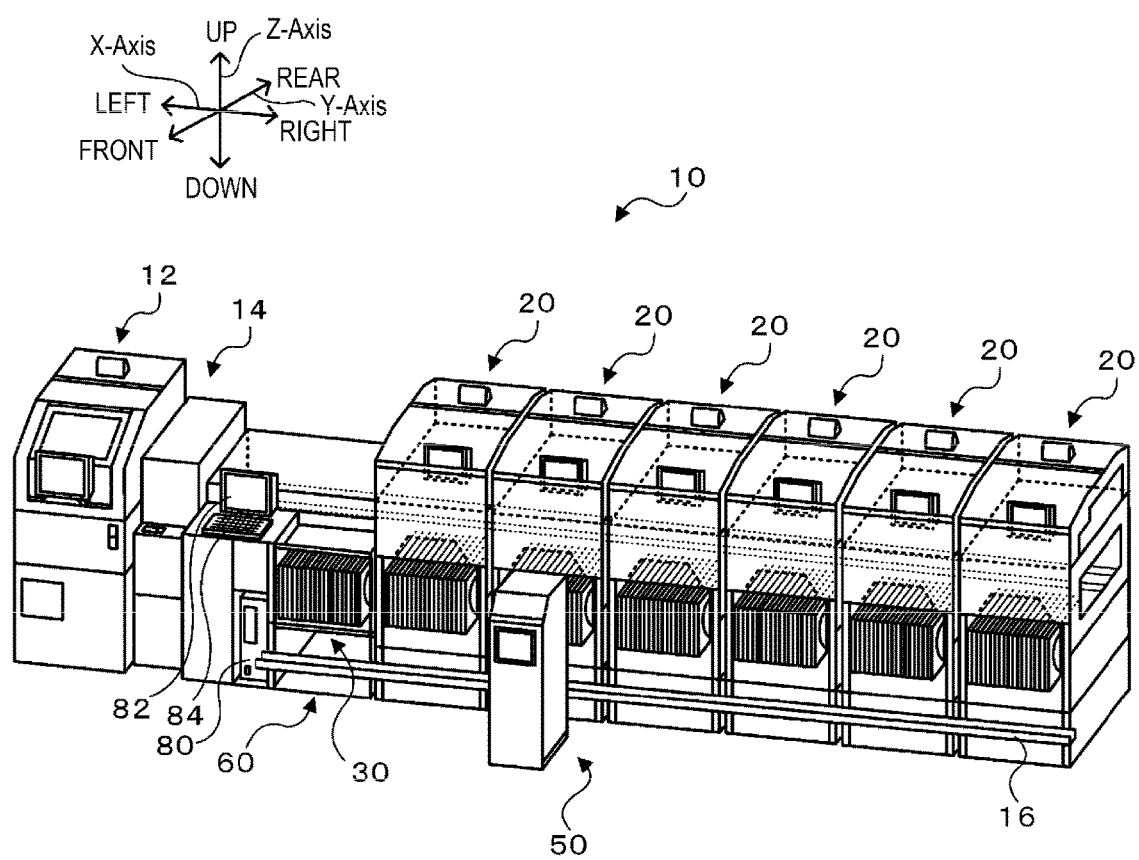
FIG. 1 is an appearance perspective view of a component mounting system.
Figure 2:
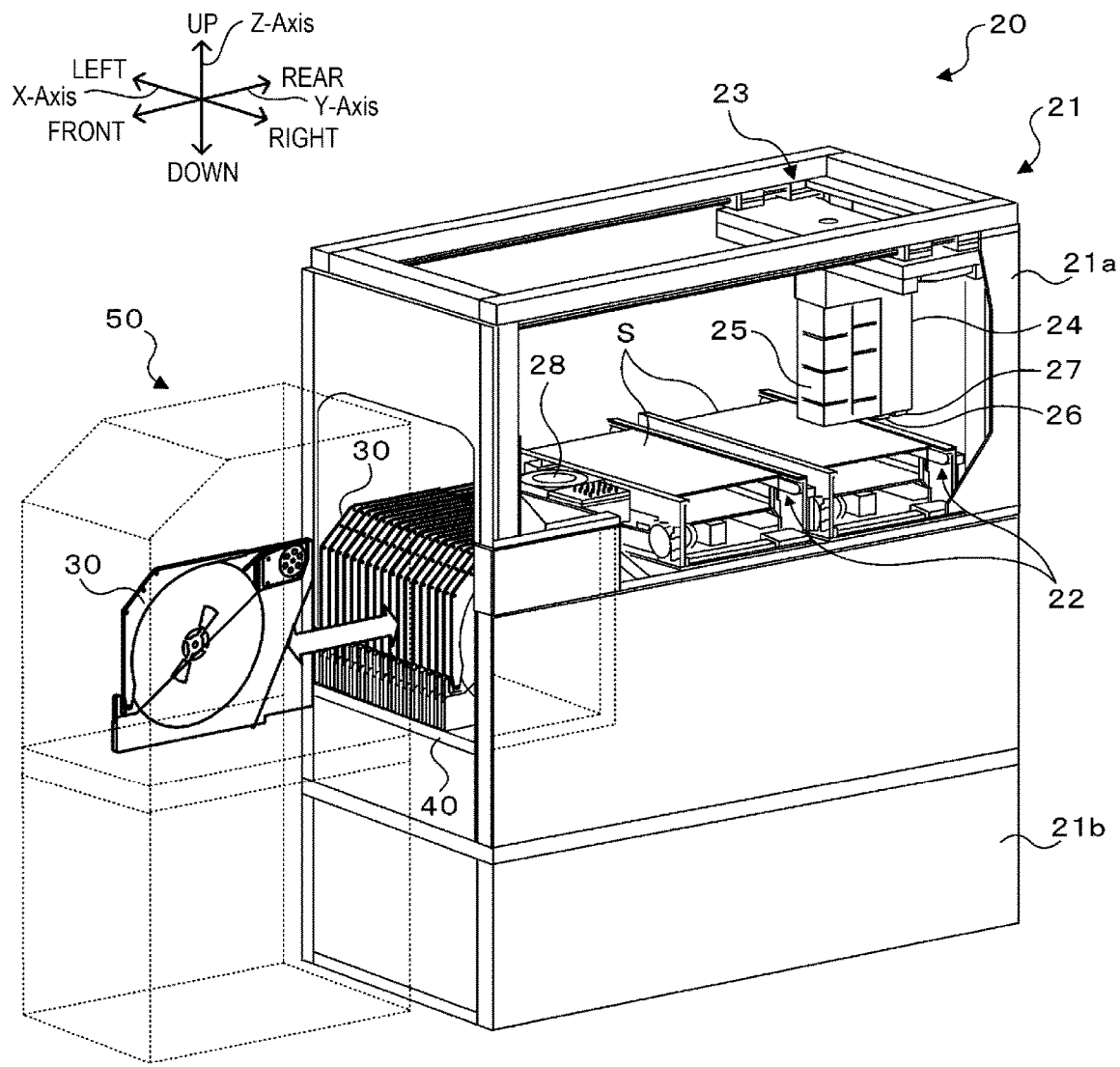
FIG. 2 is a schematic configuration view of a component mounting machine.
Figure 3:
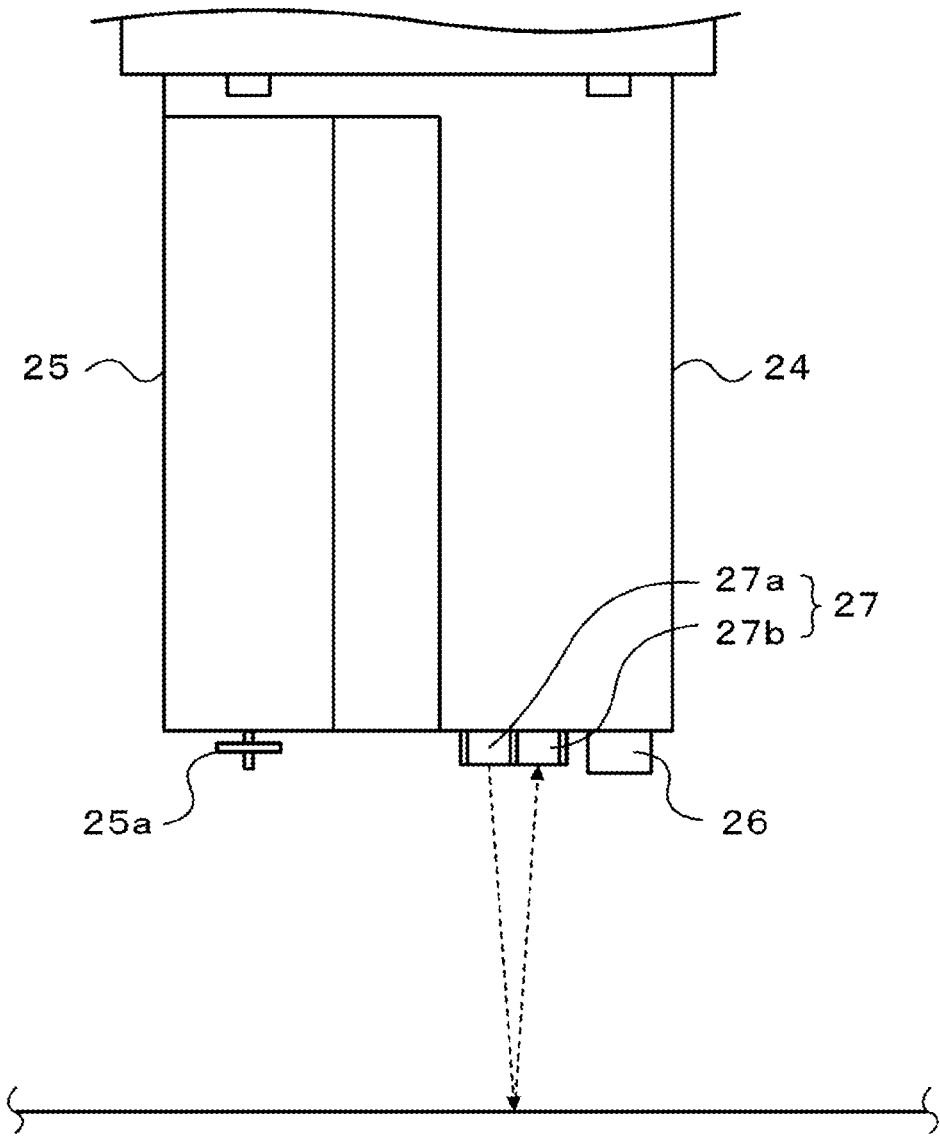
FIG. 3 is a side view of a mounting head.
Figure 4:
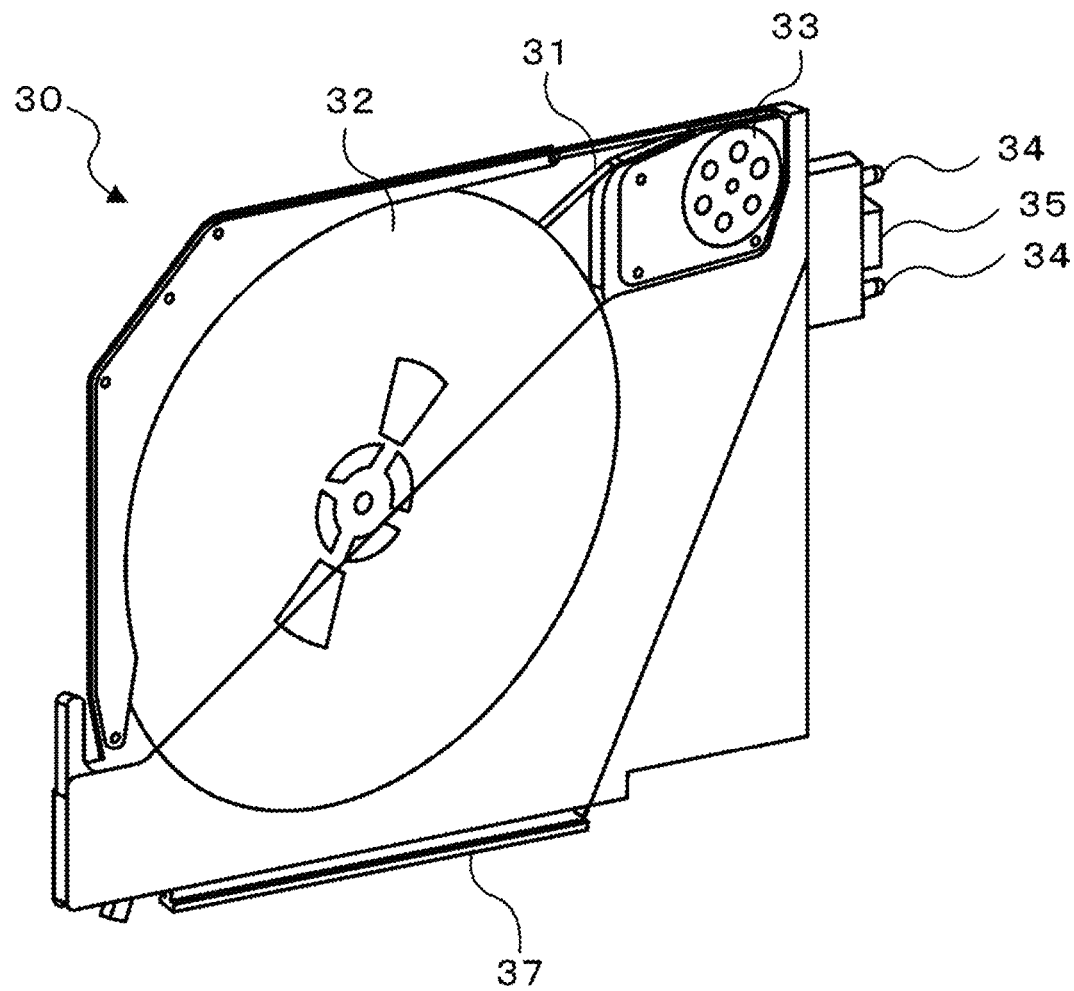
FIG. 4 is a schematic configuration view of a feeder.
Figure 5:
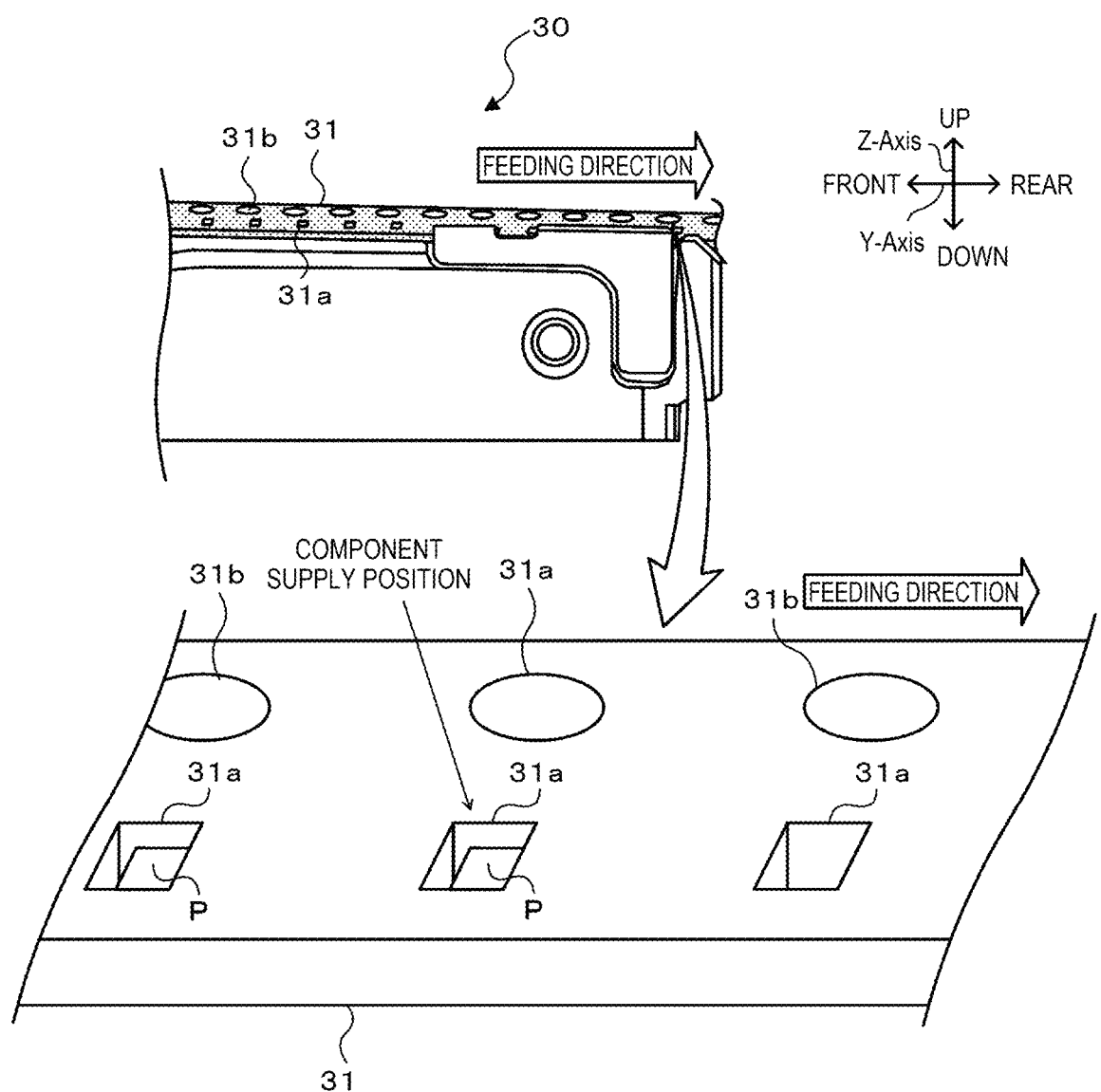
FIG. 5 is a partially enlarged view of the vicinity of a component supply position of the feeder.
Figure 6:
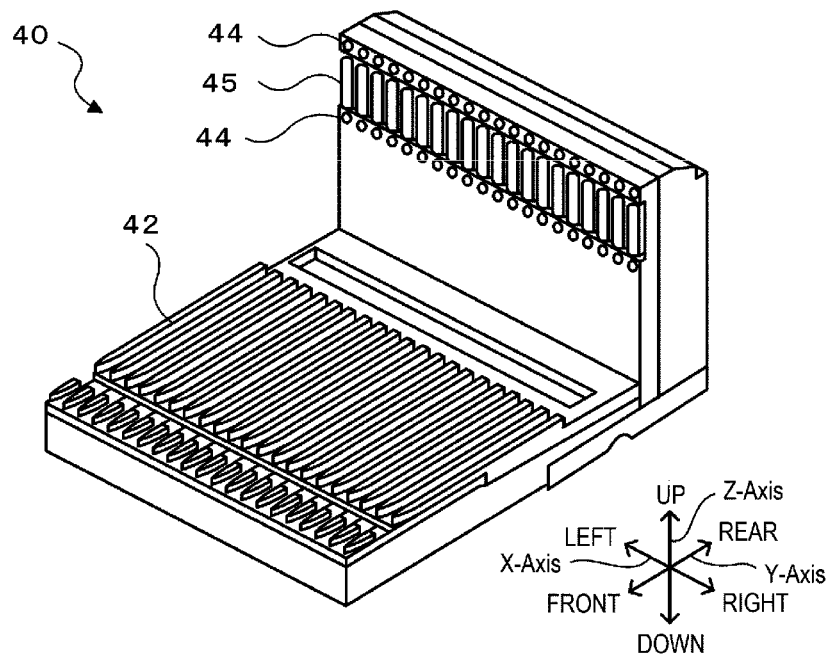
FIG. 6 is an appearance perspective view of a feeder base.
Figure 7:
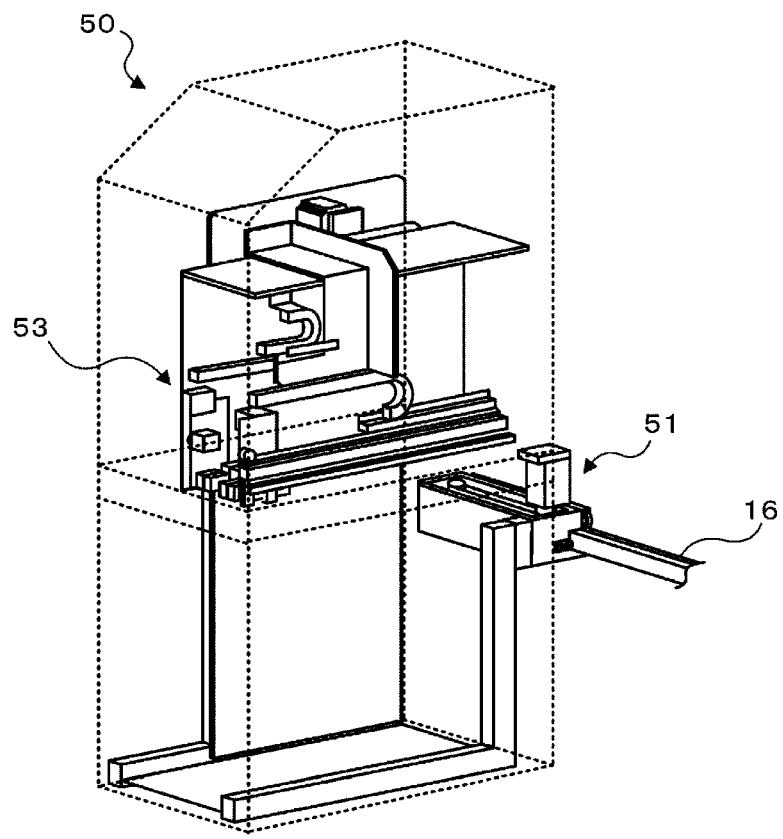
FIG. 7 is a schematic configuration view of a feeder exchange robot.
Figure 8:
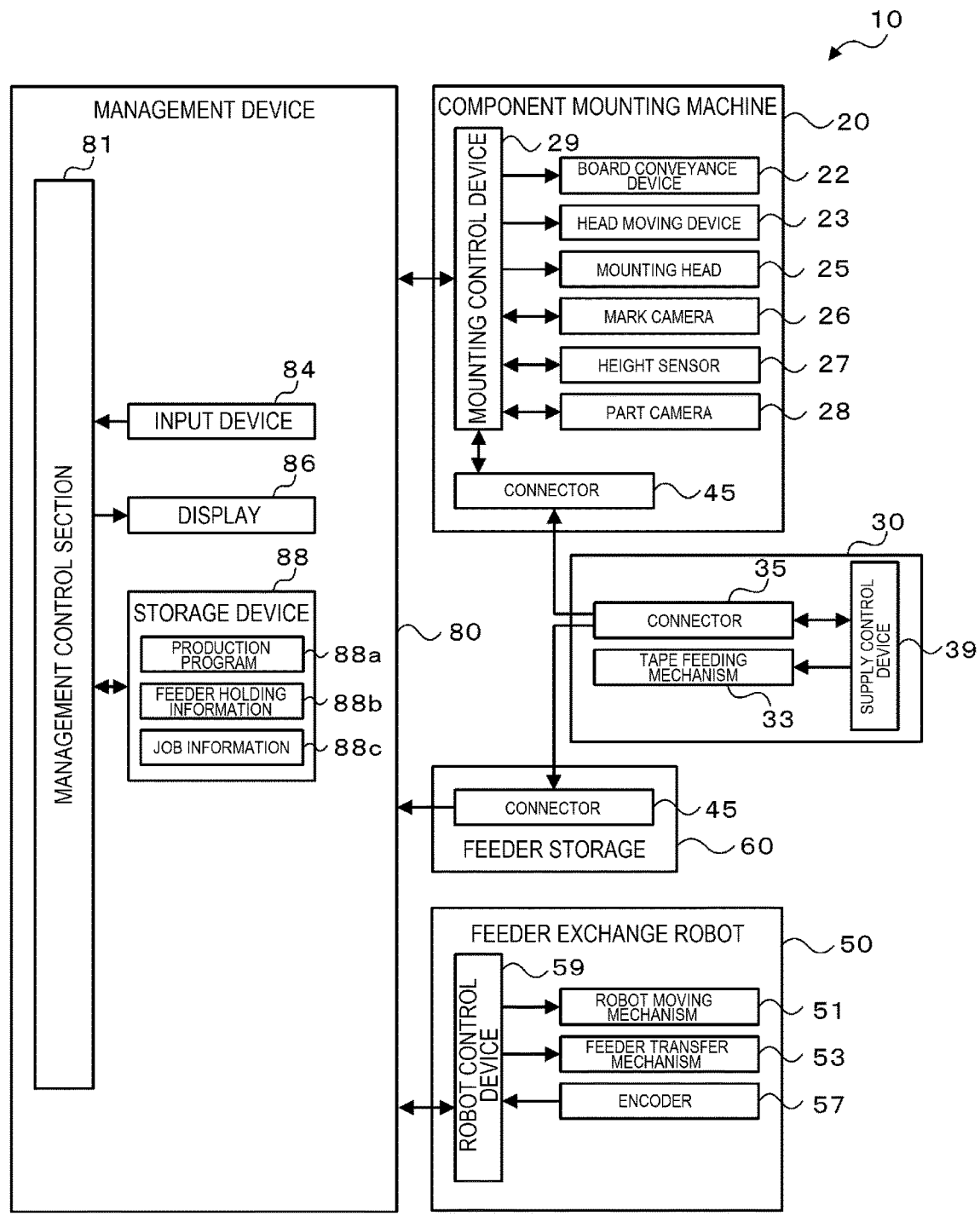
FIG. 8 is a block diagram illustrating electrical connection relationships of a component mounting system.

Next, an embodiment of the present disclosure will be described while referring to accompanying drawings. FIG. 1 is an appearance perspective view of a component mounting system. FIG. 2 is a schematic configuration view of a component mounting machine. FIG. 3 is a side view of a mounting head. FIG. 4 is a schematic configuration view of a feeder. FIG. 5 is a partially enlarged view of the vicinity of a supply position of the feeder. FIG. 6 is an appearance perspective view of a feeder base. FIG. 7 is a schematic configuration view of a feeder exchange robot. FIG. 8 is a block diagram illustrating electrical connection relationships of the component mounting system. In FIGS. 1 and 2, a left-right direction is set as an X-axis direction, a front-rear direction is set as a Y-axis direction, and an up-down direction is set as a Z-axis direction.

As illustrated in FIG. 1, component mounting system 10 includes printing device 12, print inspection device 14, multiple component mounting machines 20, mount inspection device (not illustrated), feeder exchange robot 50, feeder storage 60, and management device 80 that manages the entire system. Printing device 12 is a device for printing solder on board S. Print inspection device 14 is a device for inspecting a state of the solder printed by printing device 12. Component mounting machines 20 are devices that are aligned along the conveyance direction (X-axis direction) of board S, and mount the components supplied from feeder 30 on board S. The mount inspection device is a device that inspects a mounting state of the components mounted by component mounting machine 20. Printing device 12, print inspection device 14, component mounting machines 20, and the mount inspection device are installed side by side in the conveyance direction of board S in this order and configures a production line. Feeder exchange robot 50 can move along the production line, and replenishes multiple component mounting machines 20 with necessary feeders 30 or collects feeders 30 used up from component mounting machines 20. Feeder storage 60 is incorporated into the production line and stores feeders 30 of a use plan and feeders 30 used up in component mounting machines 20.

As illustrated in FIG. 2, component mounting machine 20 includes mounting machine main body 21 and feeder 30 that can be attached to and detached from mounting machine main body 21.

Mounting machine main body 21 includes board conveyance device 22 for conveying board S, mounting head 25 that is fixed (mounted) to slider 24 and takes out components supplied to a component supply position by feeder 30 to mount the same on board S, head moving device 23 that moves mounting head 25 together with slider 24 in a front-rear direction and a left-right direction (XY-directions), and mounting control device 29 (refer to FIG. 8). Board conveyance device 22, head moving device 23, and mounting head 25 are disposed in housing 21a provided on base 21b. Mounting head 25 includes suction nozzle 25a for picking up component P, and a lifting and lowering device (not illustrated) for lifting and lowering suction nozzle 25a by a ball screw mechanism, a linear motor, or the like.

In addition, mounting machine main body 21 includes mark camera 26, height sensor 27, part camera 28, and the like.

As illustrated in FIG. 2, mark camera 26 and height sensor 27 are attached to slider 24, and are moved in the XY-directions by head moving device 23. Mark camera 26 and height sensor 27 may be attached to mounting head 25. Mark camera 26 images a reference mark attached to board S from above. The captured image is used to confirm the position in the XY-directions of board S loaded into the machine by board conveyance device 22. In addition, in the present embodiment, mark camera 26 images the component supply position of feeder 30 from above. This captured image is used for confirming the component shortage of feeder 30 by determining whether the component is present in the captured image.

As illustrated in FIG. 3, height sensor 27 is a reflective distance sensor (for example, a laser sensor or a photoelectric sensor) having light projecting section 27a that emits light downward and light receiving section 27b that receives reflected light. Height sensor 27 is used to measure a height of a top surface of board S (position in the Z-direction). In addition, in the present embodiment, height sensor 27 is also used to confirm the component shortage of feeder 30 by measuring the height of feeder 30 at the component supply position. That is, height sensor 27 measures a height of a target object by a thickness of the component in a case where the component is present at the component supply position higher than that in a case where the component is not present at the component supply position. Therefore, the presence or absence of the component in the component supply device can be determined by using a measured value of height sensor 27, so that the component shortage of feeder 30 can be confirmed.

As illustrated in FIG. 2, part camera 28 is installed adjacent to board conveyance device 22, and images the component from below when suction nozzle 25a that has picked up the component passes above part camera 28. The captured image is used for determination of a pickup error in which a component is not picked up by suction nozzle 25a, determination of a positional deviation amount of the component picked up by suction nozzle 25a, and the like.

Mounting control device 29 is configured of a well-known CPU, a ROM, a RAM, and the like. Mounting control device 29 receives image signals from mark camera 26 and part camera 28, a detection signal from height sensor 27, and the like. In addition, mounting control device 29 outputs drive signals to board conveyance device 22, mounting head 25, head moving device 23, and the like.

As illustrated in FIG. 4, feeder 30 is a rectangular cassette-type tape feeder, and includes tape reel 32, tape feeding mechanism 33, connector 35, rail member 37, and supply control device 39 (refer to FIG. 8). Tape 31 is wound on tape reel 32. As illustrated in FIG. 5, tape 31 has cavities 31a formed at predetermined intervals along a longitudinal direction thereof. Each cavity 31a accommodates component P. These components P are protected by a film covering a top surface of tape 31. Tape feeding mechanism 33 is a mechanism for drawing tape 31 from tape reel 32 and feeding tape 31 to the component supply position, and includes a sprocket provided on an outer periphery with engagement claws that engage with sprocket holes 31b provided at equal intervals on tape 31, and a feeding motor (not illustrated) that rotationally drives the sprocket. Feeder 30 sequentially supplies components P accommodated in tape 31 to the component supply position by driving the sprocket by a predetermined rotation amount by a feeding motor to feed tape 31 engaged with the sprocket by a predetermined amount. The component accommodated in tape 31 is in an exposed state at the component supply position by peeling off the film before the component supply position, and is picked up by suction nozzle 25a. Two positioning pins 34 protruding in an attachment direction are provided on both sides of connector 35. Rail member 37 is provided at a lower end of feeder 30 and extends in the attachment direction. Supply control device 39 is configured of a well-known CPU, a ROM, a RAM, or the like, and outputs a drive signal to tape feeding mechanism 33 (feeding motor). In addition, supply control device 39 can communicate with a control section (for example, mounting control device 29 or management control device 81) that is an attachment destination of feeder 30 via connector 35.

Feeder 30 is detachably held by feeder base 40 provided on a front surface of housing 21a of mounting machine main body 21. Multiple feeders 30 are attached to feeder base 40 so as to be arranged in the X-axis direction. As illustrated in FIG. 6, feeder base 40 is a base having an L-shaped side view and includes slot 42, two positioning holes 44, and connector 45. Rail member 37 of feeder 30 is inserted into slot 42. Two positioning pins 34 of feeder 30 are inserted into two positioning holes 44, and feeder 30 is positioned at feeder base 40. Connector 45 is provided between two positioning holes 44 and is connected to connector 35 of feeder 30.

As illustrated in FIG. 1, feeder exchange robot 50 is movable along guide rail 16 provided on a front surface of multiple component mounting machines 20 and a front surface of feeder storage 60 in parallel with the conveyance direction (X-axis direction) of the board. As illustrated in FIG. 7, feeder exchange robot 50 includes robot moving mechanism 51, feeder transfer mechanism 53, encoder 57, and robot control device 59. Robot moving mechanism 51 moves feeder exchange robot 50 along guide rail 16. Feeder transfer mechanism 53 transfers feeder 30 between component mounting machine 20 and feeder storage 60. Encoder 57 detects a movement position of feeder exchange robot 50 in the left-right direction (X-axis direction). Robot control device 59 is configured of a well-known CPU, a ROM, a RAM, or the like, receives a detection signal from encoder 57, and outputs drive signals to robot moving mechanism 51 and feeder transfer mechanism 53. Feeder exchange robot 50 moves to a position where it faces component mounting machine 20 so as to attach and detach feeders 30 to and from feeder base 40 of component mounting machine 20 by controlling robot moving mechanism 51 and feeder transfer mechanism 53.

In feeder storage 60, feeder base 40 having the same configuration as feeder base 40 provided in component mounting machine 20 is provided at the same height as feeder base 40 of component mounting machine 20 in order to accommodate multiple feeders 30. Feeder exchange robot 50 controls robot moving mechanism 51 and feeder transfer mechanism 53 to move to a position where it faces feeder storage 60, so that feeder 30 can be attached and detached to and from feeder base 40 of feeder storage 60. Therefore, feeder exchange robot 50 can take out feeder 30 of the use plan stored in feeder storage 60, mount feeder 30 on necessary component mounting machine 20, or collect feeder 30 that has been used in component mounting machine 20, and accommodate feeder 30 in feeder storage 60.

Figure 9:
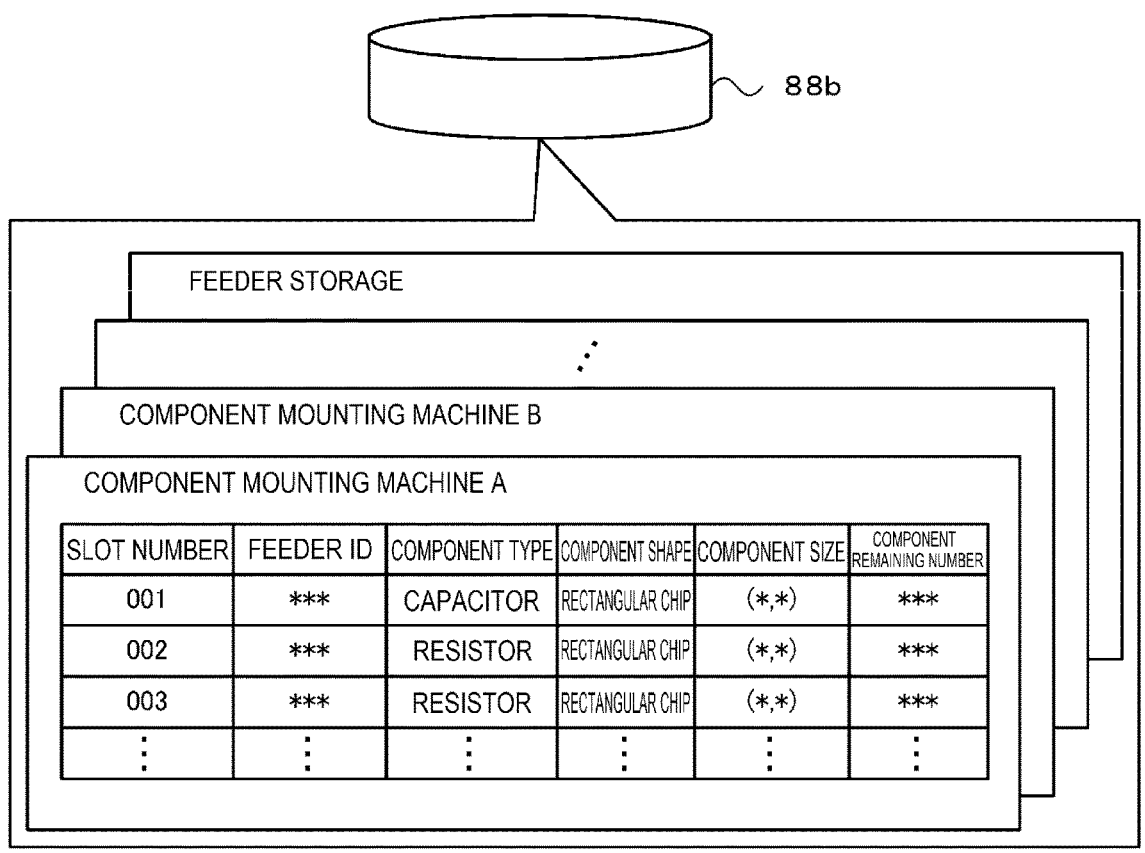
FIG. 9 is an explanatory diagram illustrating an example of feeder holding information.

Management device 80 is a general-purpose computer, and as illustrated in FIG. 8, includes management control device 81, input device 84 such as a keyboard and a mouse, display 86, and storage device 88. Management control device 81 includes a CPU, a ROM, a RAM, and the like, and is electrically connected to input device 84, display 86, and storage device 88. Storage device 88 is HDD or SSD and stores a production program, feeder holding information, job information, status information, and the like. Here, the production program is a program specifying for each component mounting machine 20 such as determining: which components are mounted on which board S in which order, or how many board S so mounted is produced. The feeder holding information is information as to feeder 30 held by each component mounting machine 20 and feeder storage 60. As illustrated in FIG. 9, the feeder holding information includes a slot number and a feeder ID of feeder base 40 on which feeder 30 is mounted, a type of a component (component type), a component shape (for example, a rectangular chip or an odd-shaped component having a shape in which the upper surface and the lower surface are different from each other), a component size (x, y) (x is a horizontal width and y is a vertical width), component remaining number M included in feeder 30, and the like. The job information is information as to a mounting instruction to each component mounting machine 20. The job information includes the type of suction nozzle 25a, the type and size of the component to be mounted, the mounting position, and the like. The status information is information indicating the operation status of each component mounting machine 20, and includes statuses such as during board loading, during board unloading, during the production (including during the suction operation and during the mounting operation), and during the error stoppage.

Management device 80 is communicably connected to mounting control device 29 with each other by wire, and exchanges various information with each component mounting machine 20. Management device 80 receives an operation status from each component mounting machine 20 and updates the status information to a latest one. In addition, management device 80 is communicably connected to supply control device 39 of feeder 30 attached to feeder base 40 of each component mounting machine 20 via mounting control device 29. When feeder 30 is detached from component mounting machine 20 or new feeder 30 is attached to component mounting machine 20, management device 80 receives an attachment or detachment status from corresponding component mounting machine 20 and updates the feeder holding information to a latest one. In addition, management device 80 is communicably connected to robot control device 59 with each other wirelessly, and exchanges various information with feeder exchange robot 50. In addition to what has been described above, management device 80 is also communicably connected to each control device of printing device 12, print inspection device 14, and the mount inspection device, and also exchanges various information from the corresponding devices. Management device 80 determines whether a setup change has occurred based on the job information stored in storage device 88, the mounting status received from mounting control device 29 of each component mounting machine 20, or the like, and transmits an instruction for the setup change to robot control device 59 when it is determined that the setup change has occurred. In addition, when receiving the component shortage information indicating that feeder 30 has run out of the component from mounting control device 29 of each component mounting machine 20, management device 80 transmits an instruction to collect feeder 30 of the component shortage and to refill new feeder 30 to robot control device 59. Further, when receiving the error information from mounting control device 29, management device 80 outputs a message indicating that an error has occurred to display 86 to notify the operator of the error.

Figure 10:
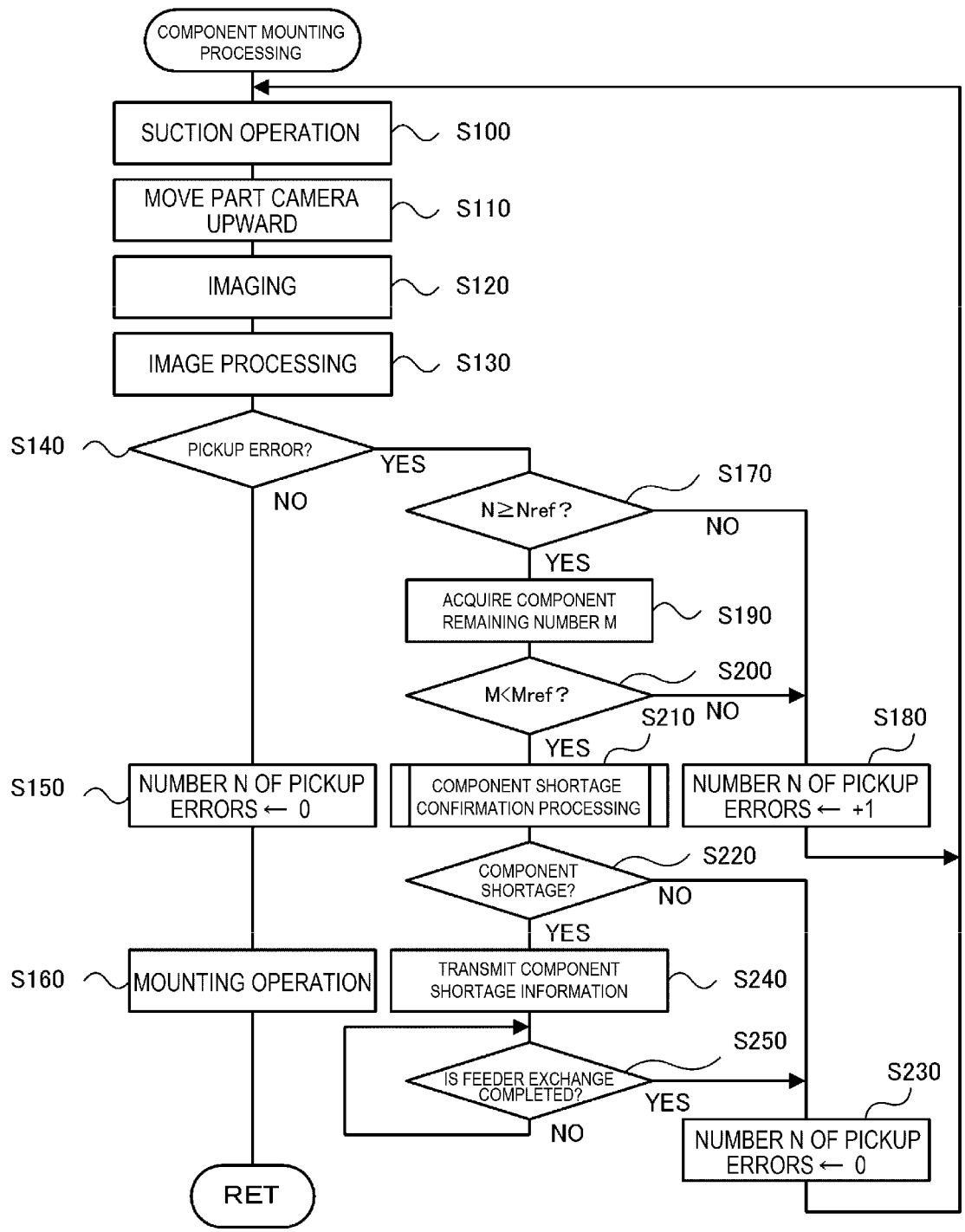
FIG. 10 is a flowchart illustrating an example of component mounting processing.

Next, an operation of each component mounting machine 20 will be described. FIG. 10 is a flowchart illustrating an example of component mounting processing executed by the CPU of mounting control device 29 of each component mounting machine 20. This processing is executed when a mounting instruction including the job information is received from management control device 81.

In the component mounting processing, mounting control device 29 first performs a suction operation for pickup component P supplied from feeder 30 to suction nozzle 25a (S100). Here, the suction operation is performed by controlling head moving device 23 so that suction nozzle 25a moves above the component supply position of feeder 30, then controlling the lifting and lowering device so that suction nozzle 25a lowers, and supplying a negative pressure from a negative pressure source (not illustrated) to suction nozzle 25a. Subsequently, mounting control device 29 controls head moving device 23 so that suction nozzle 25a that has performed the suction operation moves above part camera 28 (S110), thereby imaging the same by part camera 28 (S120).

Next, mounting control device 29 performs image processing on the obtained captured image (S130), and determines whether a pickup error has occurred (S140). The image processing of S130 is performed by determining whether component P can be recognized in the captured image by pattern matching or the like using a shape (shape data) of a lower surface of the component registered in advance. If it is determined that no pickup error has occurred, mounting control device 29 initializes number N of pickup errors, which will be described later, to the value 0 (S150), performs the mounting operation for mounting component P picked up by suction nozzle 25a to the mounting position of board S (S160), and terminates the component mounting processing. Here, the mounting operation is performed by controlling head moving device 23 so that suction nozzle 25a picking up component P moves above the mounting position of board S, then controlling the lifting and lowering device so that suction nozzle 25a lowers, and canceling the supply of the negative pressure to suction nozzle 25a.

If it is determined in S140 that the pickup error has occurred, mounting control device 29 determines whether number N of pickup errors is equal to or greater than defined count number Nref (for example, five times) (S 170). If it is determined that number N of pickup errors is less than defined count number Nref, mounting control device 29 increments number N of pickup errors by the value 1 (S180), returns to S100, and performs recovery processing for repeating the suction operation. On the other hand, if it is determined that number N of pickup errors is equal to or greater than the defined count number, mounting control device 29 acquires component remaining number M of feeder 30 which has supplied the component to mounting head 25 for which the pickup error has occurred, from management control device 81 (S190), and determines whether acquired component remaining number M is less than predetermined number Mref (S200). This processing is processing for determining whether component remaining number M in management is small. Predetermined number Mref is determined to be, for example, 20, 30, 50, or the like. If it is determined that component remaining number M is equal to or greater than predetermined number Mref, mounting control device 29 proceeds to S180. On the other hand, if it is determined that component remaining number M is less than predetermined number Mref, mounting control device 29 performs component shortage confirmation processing which will be described later (S210). Here, component remaining number M of feeder 30 is updated by being subtracted from the initial value in accordance with the suction operation by component mounting machine 20 by the operator registering the initial value in advance by operating input device 84. However, if the initial value input by the operator is incorrect, or if the operator manually exchanges feeder 30 during production, component remaining number M may not be a correct remaining number. Therefore, in the present embodiment, mounting control device 29 confirms the component shortage of feeder 30 by the component shortage confirmation processing when the number of the pickup errors consecutively occurs equal to or greater than defined count number Nref and component remaining number M in management is small.

If it is determined that no component shortage does not occur as a result of the component shortage confirmation processing (NO in S220), mounting control device 29 initializes number N of pickup errors to the value 0 (S230), returns to S100, and performs recovery processing. In a case where the number of pickup errors is repeated more than defined count number Nref although the component shortage does not occur, mounting control device 29 determines that an abnormality in the tape feeding of feeder 30, an abnormality in suction nozzle 25a, an abnormality in the image processing, or the like has occurred, stops the production, and notifies the operator that the abnormality has occurred.

On the other hand, if it is determined that the component shortage occurs (YES in S220), mounting control device 29 transmits the component shortage information indicating that the component shortage has occurred to management control device 81 together with the feeder ID of feeder 30 that the component shortage has occurred (S240), and waits. Management control device 81 that has received the component shortage information instructs feeder exchange robot 50 to exchange feeder 30. That is, management control device 81 instructs feeder exchange robot 50 to collect feeder 30 in which the component shortage occurs from feeder base 40 of component mounting machine 20 that has transmitted the component shortage information, and to mount new feeder 30 to feeder base 40. When new feeder 30 is mounted on feeder base 40, mounting control device 29 determines that the exchange of feeder 30 is completed (YES in S250), initializes number N of pickup errors to the value 0 (S230), returns to S100, and restarts the production. In a case where there is another feeder 30 that supplies components of the same type, mounting control device 29 basically performs the pickup of components P supplied from another feeder 30 without waiting for feeder 30 to be exchanged in order to prevent the production efficiency from being reduced. When it is determined that the component shortage has occurred in S220, mounting control device 29 may perform notification processing for notifying that the component shortage has occurred, so that a person (operator) may exchange feeder 30 instead of feeder exchange robot 50. Therefore, the component mounting system 10 can support not only feeder exchange robot 50 but also a manner in which a person exchanges feeder 30.

Figure 11:
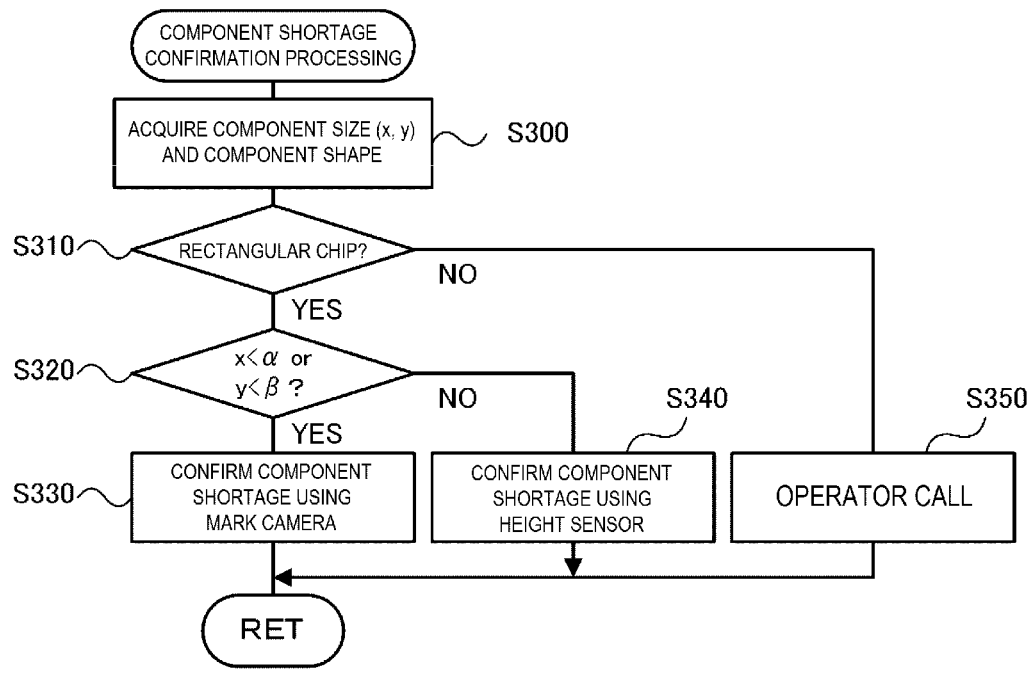
FIG. 11 is a flowchart illustrating an example of component shortage confirmation processing.

Next, the component shortage confirmation processing will be described. FIG. 11 is a flowchart illustrating an example of the component shortage confirmation processing. In the component shortage confirmation processing, mounting control device 29 first acquires a component size (x, y) and a component shape of component P that has undergone the pickup error from management control device 81 (S300), and determines whether the component shape of component P is a rectangular chip (S310), whether horizontal width x of component P is less than predetermined value $\alpha$, and whether vertical width y of component P is less than predetermined value $\beta$, respectively (S320).

When determining that the component shape of component P for which the pickup error has occurred in S310 is the rectangular chip and determining that horizontal width x of component P is less than predetermined value $\alpha$ or vertical width y is less than predetermined value $\beta$ in S320, mounting control device 29 performs the determination of the component shortage using mark camera 26 (S330), and terminates the component shortage confirmation processing. The determination of the component shortage using mark camera 26 is performed by controlling head moving device 23 so that mark camera 26 moves above the component supply position of feeder 30 of the determination target, then imaging the component supply position with mark camera 26, performing image processing on the obtained captured image, and determining whether component P is recognized in the captured image. This image processing is performed, for example, by applying pattern matching by using a shape (shape data) of a lower surface of a component registered in advance, similarly to the image processing in step S130 described above. In a case where component P is recognized by using such image processing, the image of the component recognized in the captured image obtained by imaging the component supply position with mark camera 26 is an image of an upper surface of the component. Therefore, it is difficult for mounting control device 29 to recognize a component using mark camera 26 for an odd-shaped component having a shape in which the upper surface and the lower surface are different from each other. Therefore, in a case where component P for which the pickup error has occurred is a component (for example, the rectangular chip) having the same shape (top and bottom surfaces) on the upper surface and the lower surface, mounting control device 29 performs the confirmation of the component shortage using mark camera 26. There are several methods for the image processing. For example, in addition to the method of recognizing the shape or the pattern using the pattern matching described above, a method using brightness dispersion may be used. In the former method, in order to utilize the same shape data as the image processing in S130, it is desirable that the top and bottom surfaces of the components that are the recognition targets are the same. In the latter method, since it is a method for determining whether a standard deviation of the brightness is similar to a known image processing target, it is a highly versatile method independent of the shape.

Figure 12:
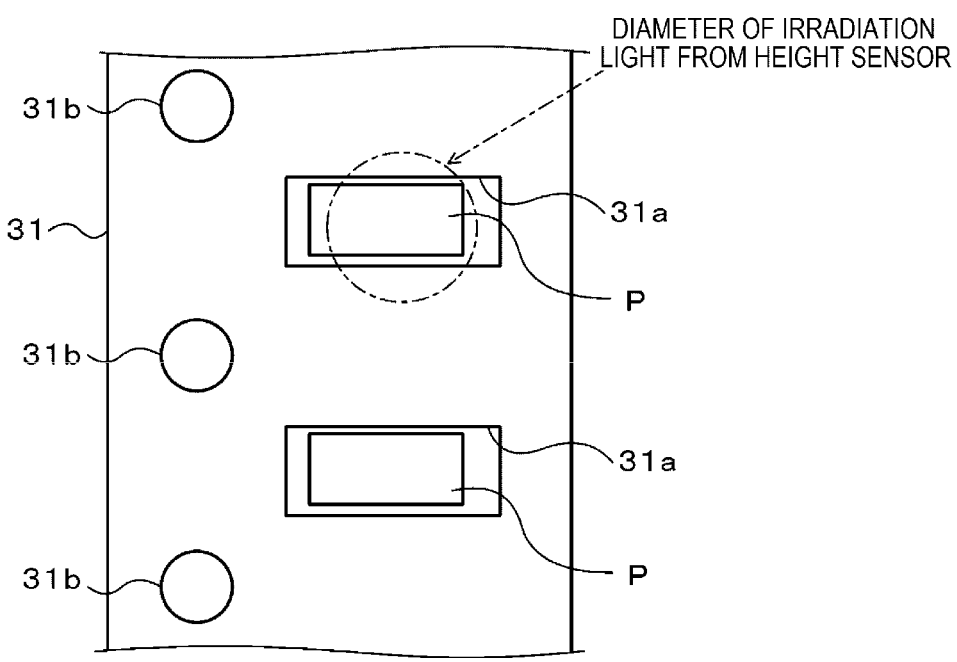
FIG. 12 is an explanatory view for explaining a diameter of irradiation light of a height sensor.

When it is determined that the component shape of component P for which the pickup error has occurred in S310 is the rectangular chip and at the same time, it is determined that horizontal width x of component P is equal to or greater than predetermined value α and vertical width y is equal to or greater than predetermined value R in S320, mounting control device 29 performs the determination of the component shortage using height sensor 27 (S340), and terminates the component shortage confirmation processing. The determination of the component shortage using height sensor 27 is performed, for example, based on the height information of the target object to be measured by controlling head moving device 23 so that height sensor 27 moves above the component supply position of feeder 30 of the determination target, irradiating the target object with light downward from light projecting section 27a, and receiving reflected light by light receiving section 27b. That is, mounting control device 29 determines that there are no components at the component supply position and the component shortage has occurred if the height of the target object measured by height sensor 27 is a height corresponding to the bottom surface of cavity 31a, and determines that there are components at the component supply position and the component shortage has not occurred if the height of the target object is higher than the bottom surface of cavity 31a by a predetermined value or more. As described above, height sensor 27 is configured as a reflective distance sensor (laser sensor or photoelectric sensor). Therefore, as illustrated in FIG. 12, if the width of cavity 31a accommodating component P of tape 31 is smaller than the diameter of the irradiation light, height sensor 27 measures the height of the top surface outside cavity 31a of tape 31, so that the presence or absence of the component at the component supply position may be erroneously determined. Therefore, in a case where the size of component P for which the pickup error has occurred is relatively large, since it is considered that the size of cavity 31a accommodating component P is also large, mounting control device 29 uses height sensor 27 to confirm the component shortage. On the other hand, in a case where the size of component P for which the pickup error has occurred is relatively small, mounting control device 29 performs the confirmation of the component shortage using mark camera 26 as described above. In addition, since irradiation light from light projecting section 27a of height sensor 27, with which the upper surface of the component is irradiated, may diffuse in the odd-shaped component, in the present embodiment, mounting control device 29 does not confirm the component shortage of feeder 30 that supplies the odd-shaped component.

As described above, mounting control device 29 selects and executes one of mark camera 26 (imaging device) and height sensor 27 (sensor) that is suitable for the confirmation of the component shortage based on the component shape and the component size. Therefore, it is possible to more appropriately perform the confirmation of the component shortage. In addition, since mark camera 26 and height sensor 27 are normally used for confirming the position and the height of board S, it is unnecessary to provide a sensor dedicated to confirm the component shortage. In addition, in a case where the imaging device is used for confirming the component shortage, the size of the detecting target may be small, but particularly in a case where pattern matching is used for the image processing, it is desirable that the top and bottom surfaces of the detecting target are the same. On the other hand, in a case where the sensor is used for the confirmation of the component shortage, the size of the detecting target may be larger although the top and bottom surfaces of the detecting target do not have to coincide with each other. Therefore, by combining a good portion of the imaging device and a good portion of the sensor, it is possible to accurately determine a wide variety of components.

If it is determined that the component shape of component P for which the pickup error has occurred in S310 is not the rectangular chip but the odd-shaped component of which the upper surface and the lower surface have different shapes, mounting control device 29 determines that it is difficult to determine the component shortage by any of mark camera 26 and height sensor 27, and performs an operator call (S350), and terminates the component shortage confirmation processing. The operator who has received the operator call visually confirms whether the component shortage has occurred in corresponding feeder 30, and inputs the presence or absence of the component shortage to the corresponding component mounting machine 20 or management device 80.

Here, a correspondence between the main elements of the present embodiment and main elements described in claims will be described. That is, feeder 30 corresponds to the feeder, mounting head 25 corresponds to the mounting head, mark camera 26 corresponds to the imaging device, height sensor 27 corresponds to the component detecting sensor, and mounting control device 29 corresponds to the control device.

It goes without saying that the present disclosure is not limited to the above-described embodiments, and may be implemented in various aspects as long as it belongs to the technical scope of the present disclosure.

For example, in the above embodiments, height sensor 27 (component detecting sensor) is configured as a reflective detecting sensor, but may be configured as a transmissive detecting sensor. The component detecting sensor may be a contact detecting sensor having a contactor and detecting a target object by contacting the contactor with the target object.

In the above-described embodiments, mounting control device 29 performs the operator call on a special component (odd-shaped component) for which it is considered difficult to confirm the component shortage using any of mark camera 26 and height sensor 27. However, mounting control device 29 may not perform the operator call. In this case, mounting control device 29 may confirm the component shortage of the odd-shaped component using height sensor 27. In addition, mounting control device 29 may omit the processing of S310 in the component shortage confirmation processing, and may select the processing (S330 and S340) to be executed based on only the component size. Alternatively, mounting control device 29 may select processing to be executed based on the type of component P (for example, an IC component such as a capacitor, a resistor, or a BGA).

In the above-described embodiments, mounting control device 29 selects and executes any of the confirmation (first determination processing) of the component shortage using mark camera 26 and the confirmation (second determination processing) of the component shortage using height sensor 27. However, mounting control device 29 may determine that the component shortage has occurred in a case where both the confirmation of the component shortage using mark camera 26 and the confirmation of the component shortage using height sensor 27 are executed, and it is determined that there are no components in any one thereof. In addition, mounting control device 29 may perform only any of the confirmation of the component shortage using mark camera 26 and the confirmation of the component shortage using height sensor 27.

In the above embodiment, mounting control device 29 uses mark camera 26 as the imaging device to confirm the component shortage of feeder 30. However, the imaging device may be any device capable of imaging the component supply position of feeder 30. In addition, the imaging device may be provided other than mounting head 25 (slider 24).

In the above-described embodiments, mounting control device 29 uses height sensor 27 as the component detecting sensor to confirm the component shortage of feeder 30. However, the component detecting sensor may be any sensor as long as it can detect the component at the component supply position. In addition, the component detecting sensor may be provided, for example, inside feeder 30 in addition to mounting head 25 (slider 24).

As described above, the component mounting machine of the present disclosure is a component mounting machine that mounts a component, which is supplied from a component supply device to a supply position, on a target object by taking out the component by a mounting head, the component mounting machine including: an imaging device configured to image the supply position from above; a component detecting sensor configured to detect the component; and a control device configured to acquire component information related to the component supplied by the component supply device when a predetermined determination condition is established and to select and execute, based on the component information, any one of multiple processing including first determination processing for determining presence or absence of a component shortage of the component supply device by determining presence or absence of the component at the supply position based on a captured image that is obtained by imaging the supply position by the imaging device, and second determination processing for determining presence or absence of the component shortage of the component supply device by detecting the presence or absence of the component at the supply position by the component detecting sensor.

According to the component mounting machine of the present disclosure, it is possible to more accurately determine the component shortage of the component supply device. Here, the component supply device includes, for example, a tape feeder for supplying a tape in which multiple components are accommodated, a tray supply device for supplying a tray in which multiple components are accommodated, and the like.

In such a component mounting machine of the present disclosure, the component information may include a size of the component and/or a shape of the component. Accordingly, it is possible to apply processing more suitable for the confirmation of the component shortage among multiple processing including the first determination processing and the second determination processing.

In the component mounting machine according to the present disclosure, the control device may perform notification processing as one of the multiple processing when a component specified by the component information is a component for which it is difficult to determine the presence or absence of the component shortage of the feeder by any of the first determination processing and the second determination processing. Accordingly, it is possible to appropriately cope with a special component that is difficult to be determined by the first determination processing or the second determination processing.

Furthermore, in the component mounting machine according to the present disclosure, the predetermined determination condition may be a condition established when a component taking-out error by the mounting head continuously occurs for a predetermined number of times. Accordingly, it is possible to suppress deterioration in the production efficiency by frequently executing the determination of the presence or absence of the component shortage.

In addition, the present disclosure is not limited to the form of the component mounting machine, but may also be a form of the component mounting system. That is, the component mounting system of the present disclosure includes multiple component mounting machines each including a component supply section on which a feeder configured to supply a component to a supply position is detachable, an imaging device configured to image the supply position from above, a component detecting sensor configured to detect the component, and a control device configured to acquire component information related to the component supplied by the feeder when a predetermined determination condition is established and to select and execute, based on the component information, any one of multiple processing including first determination processing for determining presence or absence of a component shortage of the feeder by determining presence or absence of the component at the supply position based on a captured image that is obtained by imaging the supply position by the imaging device, and second determination processing for determining presence or absence of the component shortage of the feeder by detecting the presence or absence of the component at the supply position by the component detecting sensor; and a feeder exchange device configured to exchange a feeder which is mounted on any one of the multiple component mounting machines when it is determined that a component shortage has occurred in the feeder.

According to the component mounting system of the present disclosure, it is possible to automatically perform the confirmation of the component shortage of the feeder and exchange of the feeder in which the component shortage has occurred, and to reduce the workload on the operator. In addition, the component mounting system of the present disclosure also effectively functions in a case where the operator exchanges the feeder.

In addition, the component mounting machine according to the present disclosure may be configured so as to have the following configurations. That is, a second component mounting machine of the present disclosure is a component mounting machine that mounts a component, which is supplied from a feeder to a supply position, on a target object by taking out the component by a mounting head, the component mounting machine including: an imaging device configured to image the supply position from above; and a control device configured to determine presence or absence of a component shortage of the feeder by determining presence or absence of the component at the supply position based on a captured image that is obtained by imaging the supply position by the imaging device when a predetermined determination condition is established.

In addition, a third component mounting machine of the present disclosure is a component mounting machine that mounts a component, which is supplied from a feeder to a supply position, on a target object by taking out the component by a mounting head, the component mounting machine including: a component detecting sensor configured to detect the component; and a control device configured to determine presence or absence of a component shortage of the feeder by detecting presence or absence of the component at the supply position by the component detecting sensor when a predetermined determination condition is established.

INDUSTRIAL APPLICABILITY

The present disclosure can be applied to a manufacturing industry of a component mounting machine, a component mounting system, or the like.

REFERENCE SIGNS LIST 10 component mounting system, 12 printing device, 14 print inspection device, 16 guide rails, 20 component mounting machine, 21 mounting machine main body, 21a housing, 21b base, 22 board conveyance device, 23 head moving device, 24 slider, 25 mounting head, 26 mark camera, 27 height sensor, 27a light projecting section, 27b light receiving section, 28 part camera, 29 mounting control device, 30 feeder, 31 tape, 31a cavity, 31b sprocket hole, 32 tape reel, 33 tape feeding mechanism, 34 positioning pin, 35 connector, 37 rail member, 39 supply control device, 40 feeder base, 42 slot, 44 positioning hole, 45 connector, 50 feeder exchange robot, 51 robot moving mechanism, 53 feeder transfer mechanism, 57 encoder, 59 robot control device, 60 feeder storage, 80 management device, 81 management control section, 84 input device, 86 display, 88 storage device, 88a production program, 88b feeder holding information, 88c job information, S board, P component

The invention claimed is:

1. A component mounting machine that mounts a component, which is supplied from a component supply device to a supply position, on a target object by taking out the component by a mounting head, the component mounting machine comprising:
   a camera configured to image the supply position from above;
   a height sensor configured to detect the component; and
   a control device configured to
      acquire component information related to the component supplied by the component supply device when a predetermined determination condition is established, the component information including a horizontal dimension and a vertical dimension of the component,
      determine that a size criteria is met when the horizontal dimension of the component is less than a first predetermined value and the vertical dimension of the component is less than a second predetermined value,
      when the size criteria is met, execute first determination processing for determining presence or absence of a component shortage of the component supply device by determining presence or absence of the component at the supply position based on a captured image that is obtained by imaging the supply position by the camera, and
      when the size criteria is not met, execute second determination processing for determining presence or absence of the component shortage of the component supply device by detecting the presence or absence of the component at the supply position by the height sensor.

2. The component mounting machine according to claim 1,
   wherein the component information includes a size of the component and/or a shape of the component.

3. The component mounting machine according to claim 1,
   wherein the control device performs notification processing as one of the multiple processing when a component specified by the component information is a component for which it is difficult to determine the presence or absence of the component shortage of the component supply device by any of the first determination processing and the second determination processing.

4. The component mounting machine according to claim 1,
   wherein the predetermined determination condition is a condition established when a component taking-out error by the mounting head continuously occurs for a predetermined number of times.

5. A component mounting system comprising:
   multiple component mounting machines each including a component supply section on which a feeder configured to supply a component to a supply position is detachable, a camera configured to image the supply position from above, a height sensor configured to detect the component, and a control device configured to
      acquire component information related to the component supplied by the feeder when a predetermined determination condition is established, the component information including a horizontal dimension and a vertical dimension of the component,
      determine that a size criteria is met when the horizontal dimension of the component is less than a first predetermined value and the vertical dimension of the component is less than a second predetermined value,
      when the size criteria is met, execute first determination processing for determining presence or absence of a component shortage of the feeder by determining presence or absence of the component at the supply position based on a captured image that is obtained by imaging the supply position by the camera, and
      when the size criteria is not met, execute second determination processing for determining presence or absence of the component shortage of the feeder by detecting the presence or absence of the component at the supply position by the height sensor; and
   a feeder exchange device configured to exchange a feeder which is mounted on any one of the multiple component mounting machines when it is determined that a component shortage has occurred in the feeder.

6. A component mounting machine that mounts a component, which is supplied from a feeder to a supply position, on a target object by taking out the component by a mounting head, the component mounting machine comprising:

a camera configured to image the supply position from above; and a control device configured to
- acquire component information related to the component when a predetermined determination condition is established, the component information including a horizontal dimension and a vertical dimension of the component,
- determine that a size criteria is met when the horizontal dimension of the component is less than a first predetermined value and the vertical dimension of the component is less than a second predetermined value,
- when the size criteria is met, execute first determination processing for determining presence or absence of a component shortage of the feeder by determining presence or absence of the component at the supply position based on a captured image that is obtained by imaging the supply position by the camera.

* * * * *